(12) United States Patent
Seshan

(10) Patent No.: US 6,510,356 B2
(45) Date of Patent: Jan. 21, 2003

(54) METHOD AND APPARATUS FOR PROGRAMMING A PASTE DISPENSING MACHINE

(75) Inventor: Ramanathan Seshan, Roseville, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 62 days.

(21) Appl. No.: 09/824,427

(22) Filed: Apr. 2, 2001

(65) Prior Publication Data

US 2002/0143416 A1 Oct. 3, 2002

(51) Int. Cl.$^7$ .................................................. B67D 5/00
(52) U.S. Cl. ........................ 700/95; 700/231; 700/240; 228/180.1
(58) Field of Search ........................ 700/95, 121, 240, 700/231; 222/41, 526; 427/96; 228/123.1, 180.1; 29/840, 829; 205/118, 191, 146

(56) References Cited

U.S. PATENT DOCUMENTS

| | | | | | |
|---|---|---|---|---|---|
| 4,203,132 | A | * | 5/1980 | Schmitt et al. ............. | 228/102 |
| 4,588,468 | A | * | 5/1986 | McGinty et al. ............ | 156/250 |
| 4,891,242 | A | * | 1/1990 | Ito et al. ........................ | 29/825 |
| 4,938,383 | A | * | 7/1990 | Yamazaki et al. ............ | 222/41 |
| 4,941,256 | A | * | 7/1990 | Capson et al. ............... | 228/103 |
| 5,104,689 | A | * | 4/1992 | Hayden et al. ............... | 118/323 |
| 5,110,615 | A | * | 5/1992 | Maiorca et al. ............. | 156/356 |
| 5,203,075 | A | * | 4/1993 | Angulas et al. ........ | 228/180.22 |
| 5,356,658 | A | * | 10/1994 | Hertz et al. .................. | 427/282 |
| 5,411,897 | A | * | 5/1995 | Harvey et al. ............... | 136/256 |
| 5,423,889 | A | * | 6/1995 | Colquitt et al. ............. | 156/295 |
| 5,436,028 | A | * | 7/1995 | Becher et al. ............... | 427/282 |
| 5,628,110 | A | * | 5/1997 | Sakaguchi et al. ............ | 29/832 |
| 5,709,905 | A | * | 1/1998 | Shaw et al. .................. | 101/129 |
| 5,788,143 | A | * | 8/1998 | Boyd et al. ............ | 228/180.22 |
| 5,822,210 | A | * | 10/1998 | Kobayashi et al. .......... | 700/121 |
| 5,995,232 | A | * | 11/1999 | Van Der Ven .............. | 356/395 |
| 6,254,923 | B1 | * | 7/2001 | Boyd et al. ............ | 228/180.22 |

* cited by examiner

*Primary Examiner*—Leo Picard
*Assistant Examiner*—Alexander Kosowski

(57) ABSTRACT

A method for programming a paste dispensing machine to paste a set of pads disposed on a printed circuit board for attachment of a ball-grid array component includes generating a set of input data for the paste dispensing machine. The set of input data represents a set of positions on the printed circuit board at which the pads are located and is generated using a neutral file having data that describes the layout of the printed circuit board. A set of data extracted from the neutral file that describe a set of positions on the printed circuit board relative to a first coordinate system are converted to be relative to a second coordinate system that is used by the paste dispensing machine. The converted data is then arranged in a desired pattern such that when the input data is supplied to the paste dispensing machine, the data causes the paste dispensing machine to dispense paste to the pads of the printed circuit board in the desired pattern.

23 Claims, 8 Drawing Sheets

METHOD AND APPARATUS FOR PROGRAMMING A PASTE DISPENSING MACHINE

The present invention generally relates to printed circuit boards, and, more particularly, to a method and apparatus for automatically programming a machine for dispensing paste on a printed circuit board so that a ball grid array may be attached thereto.

Paste dispensing machines are well-known in the art of printed circuit board design and assembly. More particularly, after the assembly of a printed circuit board, the board is tested so that any defective components residing on the board may be replaced in a process called reworking. During the reworking process, the defective component(s) identified during the testing process is removed from the printed circuit board and a new, defect-free component is substituted in its place. Specifically, the defect-free component is attached to the printed circuit using a process that involves soldering the defect-free component to the printed circuit board at the location where the defective component was previously positioned. Before attaching the defect-free component, a solder paste is applied to a set of pads residing on the printed circuit board. A set of input/output pins disposed on the defect-free component that align with the set of pads disposed on the printed circuit board (when the component is positioned properly) are placed in contact with the paste-laden pads and the paste causes the pads and input/output pins to stick to one another. A heating process is then used to melt the solder paste thereby forming a strong metallic bond between the pads and input/output pins causing the defect-free component to become attached to the printed circuit board. Although for most printed circuit board components the process of applying the solder paste to the appropriate pads of the printed circuit board is not particularly challenging, applying paste to the set of pads required to attach a ball-grid array component can be especially tedious and time-consuming.

More particularly, the input/output pins of a ball-grid array component are arranged in a grid-like pattern and may range from a few hundred to over a thousand. In addition, the input/output pins may be separated by distances as small as twenty mils. Thus, the corresponding pads of a printed circuit board that are arranged to accommodate the input/output pins of the ball-grid array are similarly disposed, i.e., in a grid-like pattern, separated by very small distances. As a result, a paste-dispensing machine must be used to achieve the precision necessary to apply paste to each pad individually. However, conventional paste dispensing machines, such as the CAM/ALOT-1818, must be manually programmed with information regarding the location of each pad to which paste shall be applied. Specifically, conventional paste dispensing machines include a table on which a printed circuit board may be disposed and a gantry having a track disposed therein. A set of motors that are controlled by a DOS based personal computer cause a dispensing needle mounted in the gantry track to move from side to side and further cause the gantry to move back and forth. Thus, the dispensing needle is moveable in both the x and y directions, relative to the table, and may be properly positioned to dispense the solder paste onto the pads of the printed circuit board. Further, the gantry and the dispensing needle are configured to follow the movement of a mouse or trackball associated with the paste dispensing machine. A camera extending from the gantry is directed at the table and transmits a view of a printed circuit board disposed on the table to a monitor that is also coupled to the paste dispensing machine. A machine operator views the printed circuit board via the monitor and uses the mouse or trackball to direct the movement of the gantry and thus the dispensing needle and to position the needle at each pad that requires paste. The camera may include a set of cross hairs that are viewable on the monitor that the machine operator may use to position the needle directly over the center of each pad. Upon moving the needle into the proper position, i.e., so that it is positioned above the center of a pad, the machine operator clicks the mouse or trackball causing a set of coordinates associated with the position of the dispensing needle to be stored in a memory device associated with the paste dispensing machine. This process of moving the gantry to position the dispensing needle over a pad and clicking/storing the positional coordinates is repeated for each of the set of pads that will be used to attach the ball-grid array component to the printed circuit board and is referred to as manually programming the paste dispensing machine. When the coordinates associated with each of the pads corresponding to the input/output pins of the ball-grid array component have been stored as data in a memory accessible to the computer, the paste dispensing machine uses the data to position the needle and dispense paste to the pads of the printed circuit board for attachment of the corresponding ball-grid array component.

Unfortunately, manually programming the paste dispensing machine to include the coordinates of each of the set of potentially hundreds of closely positioned pads is a very time consuming process. In addition, positioning the needle at the precise location corresponding to the center of each pad is tedious for the machine operator. Although moving the needle in a serpentine pattern (see FIG. 1) may reduce the tediousness of the process for the machine operator such a pattern involves frequently changing the direction of the gantry/needle which tends to jar the gantry and may reduce the machine's life span. Moreover, each operator must undergo a long training period that may extend for as long as three to five months before being qualified to operate the machine solo. In addition, the paste dispensing machine is not useable for other purposes while the machine is being manually programmed thereby reducing the productivity of the machine.

Thus, there is a need in the art for an apparatus and method of programming a paste dispensing machine that is less time consuming, less tedious and that is less training intensive for the machine operator.

SUMMARY OF THE INVENTION

The present invention is directed to a method for automatically programming a paste dispensing machine to dispense paste onto a printed circuit board in a manner that allows attachment of a ball-grid array component. The method includes accessing a computer file in which the coordinates of a set of input/output pins associated with the ball-grid array component are stored, and providing the coordinates as input data to a data sorting algorithm. The data sorting algorithm reorders the data to form a desired pattern, such as, for example, a spiral pattern, and the data is subsequently used to direct the movement of the paste dispensing machine. In addition to reordering the data in a desired pattern that minimizes machine movement, the data is translated from a first coordinate system to a second coordinate system that is defined relative to the manner in which the printed circuit board is oriented on the table of the paste dispensing machine. The resulting data set is then made available to the paste dispensing machine operator who may supply the data to the machine for use in applying paste to the pads of the printed circuit board that correspond and align with the locations at which the input/output pins associated with the ball-grid array component are disposed.

DETAILED DESCRIPTION

Figure 3:
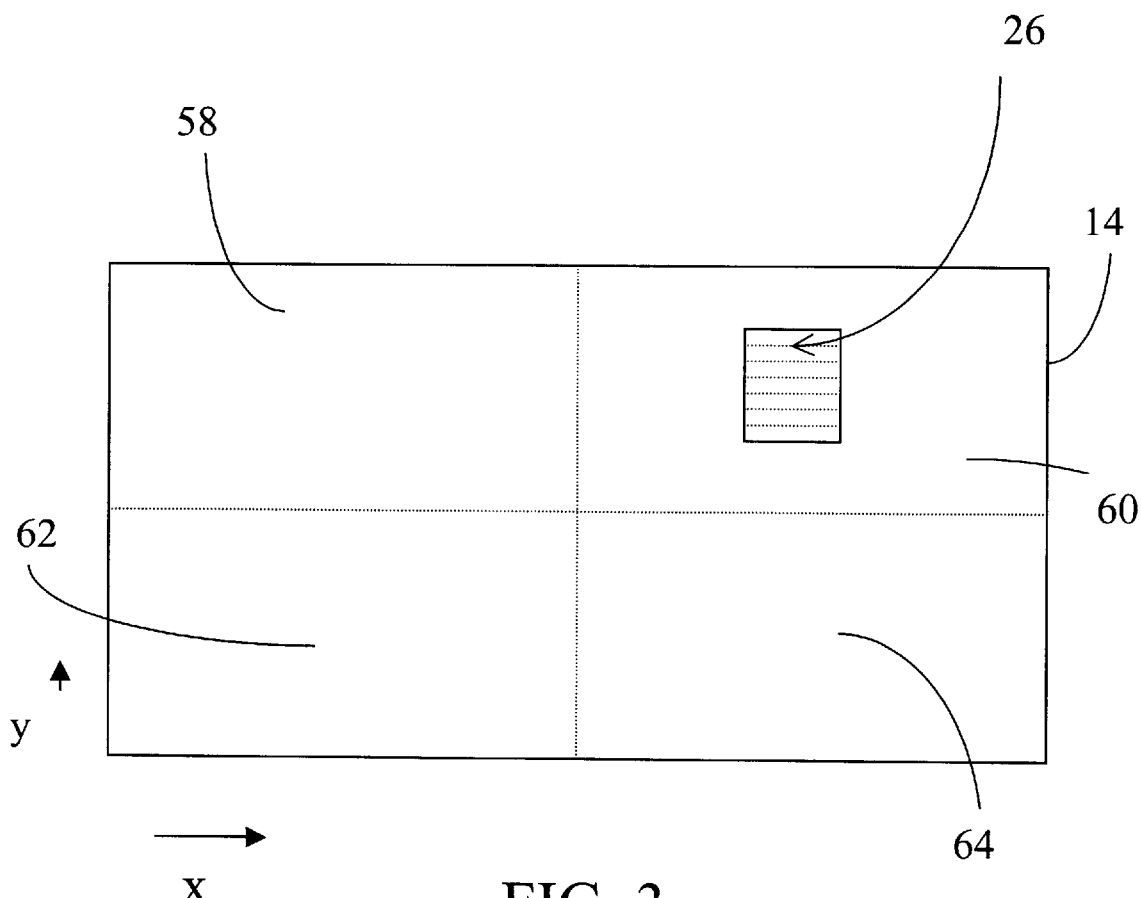
FIG. 3 is a plan view of a printed circuit board having a set of pads to which a set of input/output pins associated with a ball-grid array component may be attached.
Figure 2:
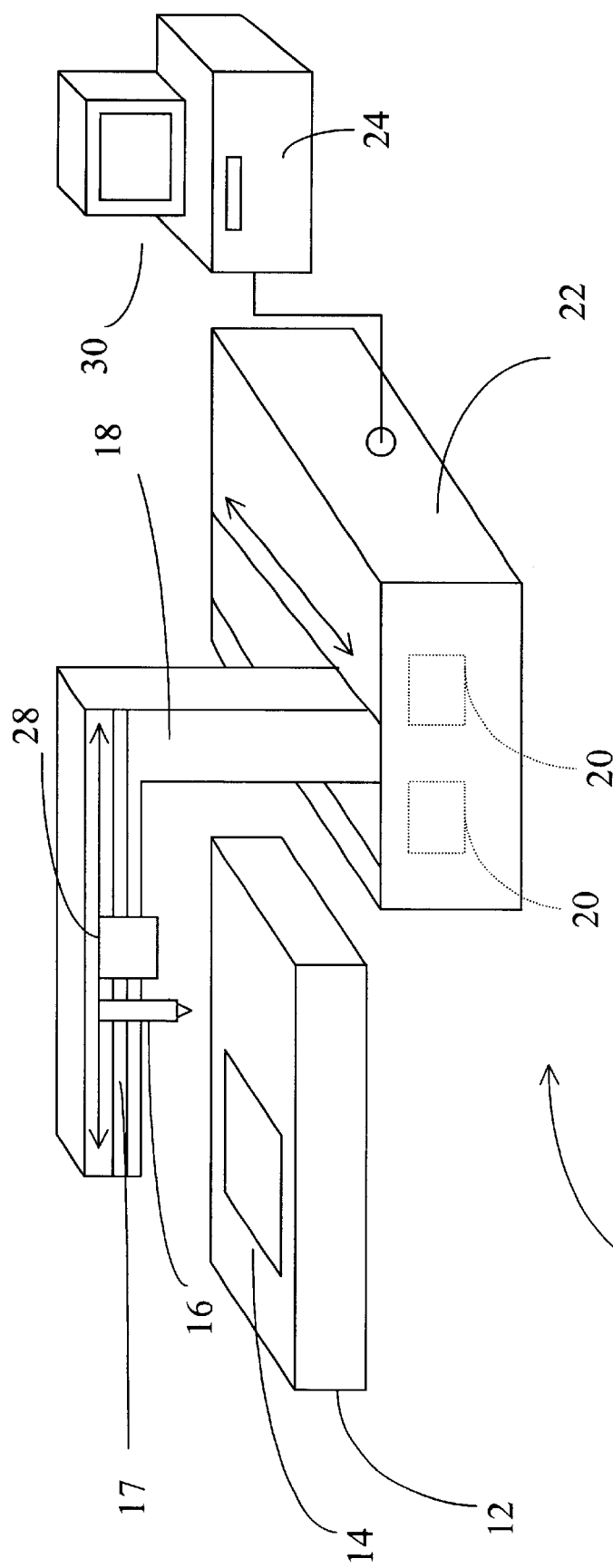
FIG. 2 is a perspective view of a paste dispensing machine adapted and configured to operate according to the method of the present invention.

Referring now to FIGS. 2 and 3, a paste dispensing machine 10 includes a table 12 on which a printed circuit board 14 may be disposed. A dispensing paste-dispensing needle 16 is slideably disposed in a track 17 that extends the length of a gantry 18. A set of motors 20 disposed within a housing 22 and controlled by a computer 24 cause the needle to slide from side to side above the table 12 and further cause the gantry 18 to move back and forth thereby enabling movement of the needle in the x and y directions. Further, the computer 24 may be programmed to cause the motors 20 to move the needle 16 to each of a set of locations that are defined in a data set of x-y coordinates and that align with a set of pads 26 disposed on the printed circuit board 14. Each of the set of pads 26 corresponds to and aligns with a different one of a set of input/output pins disposed on a ball-grid array component that may be attached to the printed circuit board 14 using solder paste. Specifically, the computer 24 may cause the dispensing needle 16 to be positioned at each location defined in the data set and may further cause the needle 16 to dispense solder paste onto the pad 26 disposed at each location. A heating process may then be used to re-flow the paste and strengthen the attachment. The paste dispensing machine may further include a camera 28, also slideably disposed in the track residing in the gantry 18, that transmits a view of the printed circuit board 14 to a monitor 30 associated with the computer 24.

Figure 4:
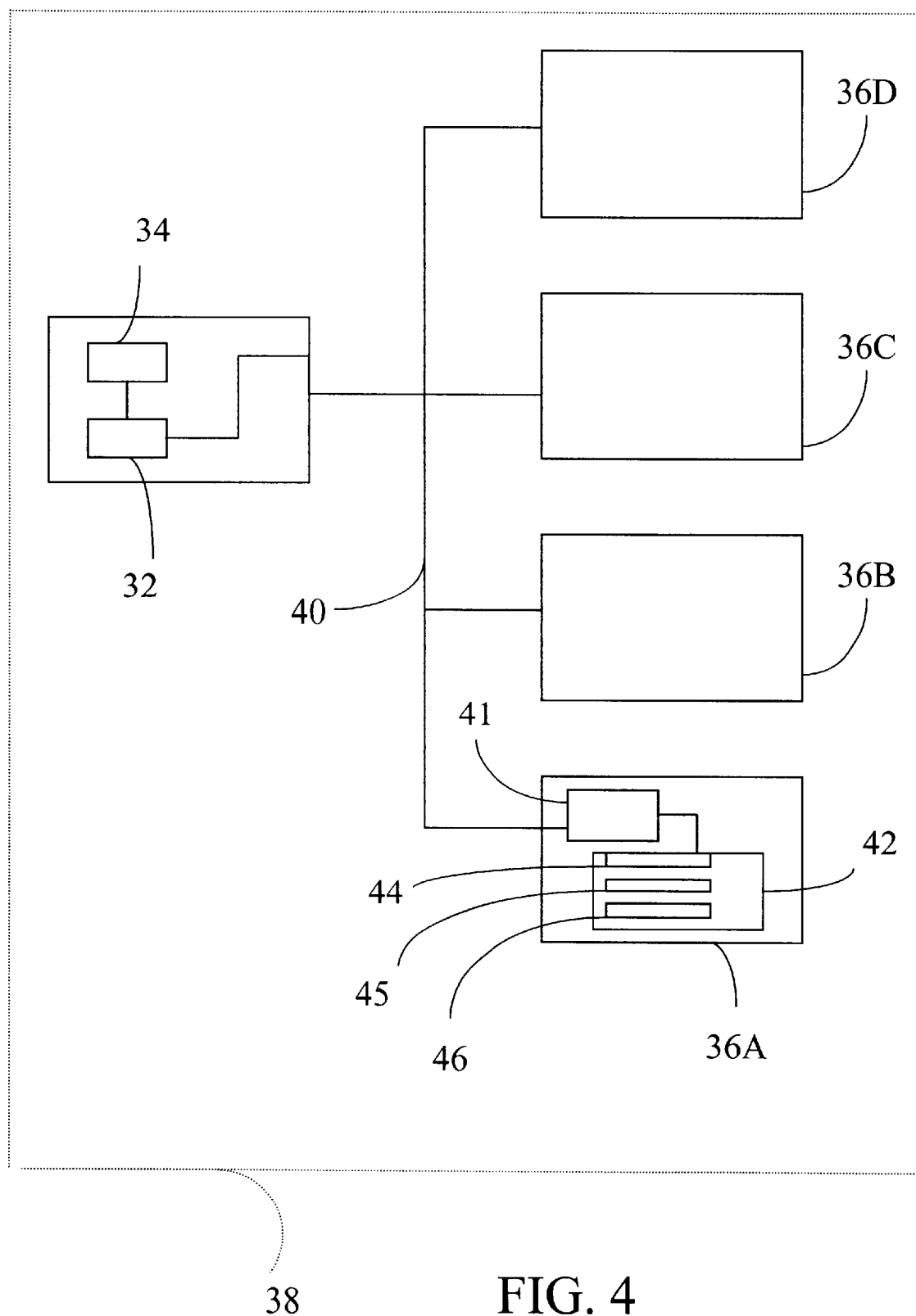
FIG. 4 is a block diagram of a computer associated with the paste dispensing machine of FIG. 2 that is coupled to a set of computers via a network.

Referring also to FIG. 4, the computer 24 may include a processor 32 and a memory device 34 and may further be coupled to a set of computers 36A, 36B, 36C and 36D via a network 38, thus forming an intranet 40. At least one of the computers 36A includes a processor 41 coupled to a memory device 42 for storing a computer file referred to as a neutral file 44 that includes layout data in a neutral format. The memory device 42 may further store a software program 46 for performing computer-aided design, such as the EECAD design software provided by Mentor Graphics Corporation so that the computer 36 may be used as a computer-aided design (CAD) tool that is capable of designing the printed circuit board 14 and generating the neutral file residing in the memory device 42. As will be understood by one having skill in the art, the neutral file 44 is typically created using a printed circuit board CAD design tool. Specifically, conventional printed circuit board CAD design tools enable the creation of a computer layout file that provides a detailed description of the printed circuit board design including, for example, the dimensions of the printed circuit board 14 and the components disposed thereon, and the location at which each component is positioned on the printed circuit board 14 including the orientation of each component relative to the printed circuit board 14. In addition, conventional printed circuit board CAD design tools typically include a feature that enables the generation of the neutral file which contains the data included in the layout file presented in a neutral, computer readable format. The neutral file 44 is described as "neutral" because a specific type of software application is not required to open the file, rather the file may be read using any software application that is capable of reading text. Further, the text included in the neutral file 44 is typically arranged according to a predefined order or format and includes, for example, predefined text tags that are used to describe the printed circuit board data. In addition, the layout file is typically constructed using a standard component library (not shown) that includes the configuration and dimensions of a plurality of standard circuit components, such as, for example, resistors, capacitors and ball-grid array components. And, as will further be understood by one having ordinary skill in the art, the components described in the standard component library are typically positioned in a conventional orientation and thus, are described in the layout file (and thus the neutral file) as being disposed on the printed circuit board 14 in the conventional orientation unless the printed circuit board 14 designer chooses to rotate the component thereby changing the orientation of the component on the printed circuit board 14.

Figure 5A:
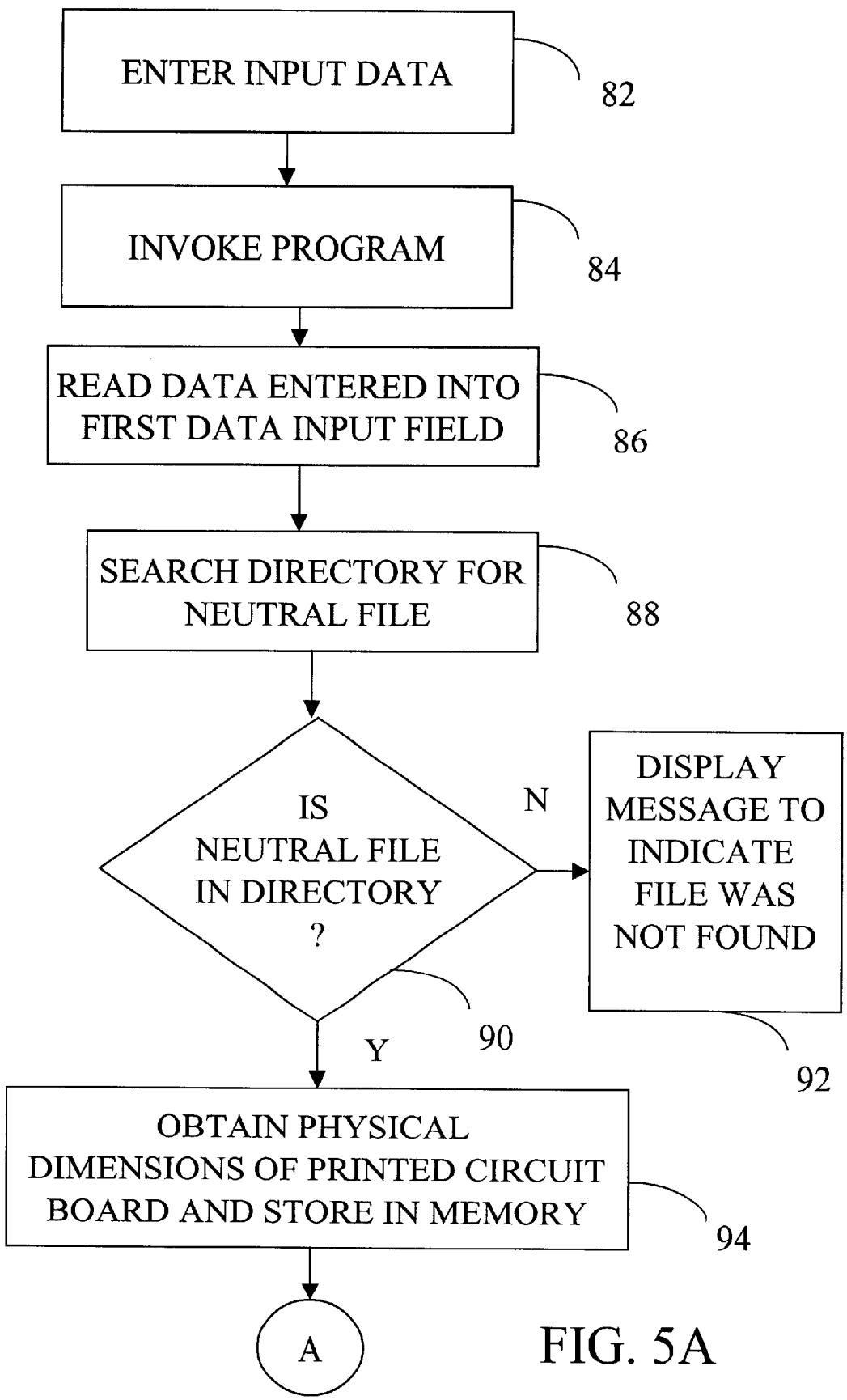
FIGS. 5A, 5B and 5C illustrate a flow chart of a method for generating a set of input data for a paste dispensing machine according to the method of the present invention.
Figure 6:
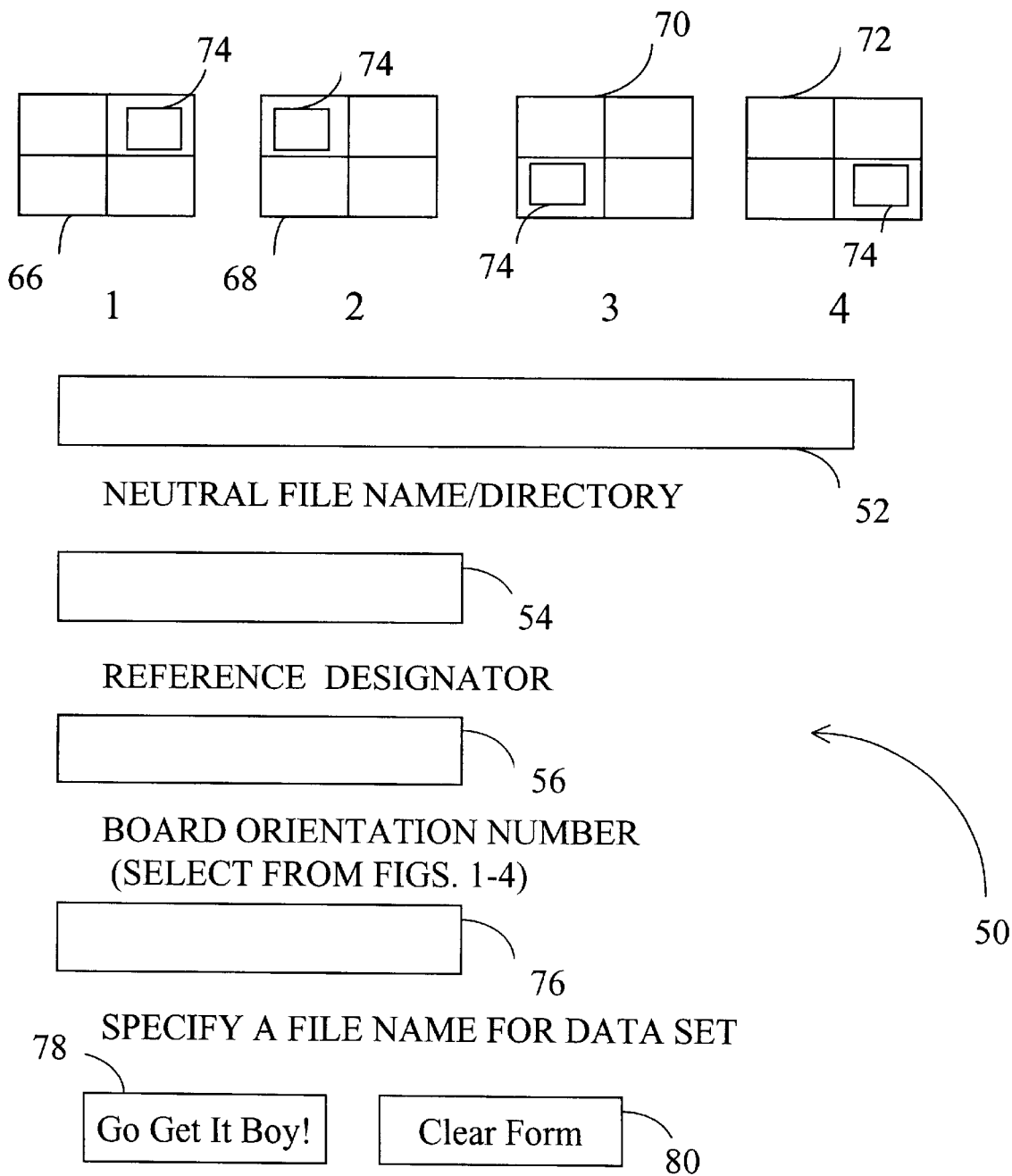
FIG. 6 is a diagram of a data input screen 50 at which a user may enter data to be provided to one of the computers of FIG. 4.

A flowchart 80 is shown in FIG. 5A which illustrates a method of automatically generating a data set that may be used to program the paste dispensing machine 10 to dispense paste onto the printed circuit board 14 may be implemented with a software program. The software program may be executed using, for example, the processor 41 disposed in the computer 36A and may begin when the user enters a set of input data (step 82) that will subsequently be used by the processor 36A to generate the data set as will be described in greater detail below. Specifically, the user may begin entering the input data by first accessing a web browser (not shown) at any of the computer devices 36B–36D coupled to the network 38. Referring also to FIG. 6, once the web browser is accessed, the user may enter a Universal Resource Locator (URL) into a data input field supplied by the web browser and the entry of the URL may cause the web browser to access a data entry screen 50 located at the URL. The data entry screen 50 may include a first data input field 52 at which the user may enter the name of the neutral file 44 and the name of a directory in which the neutral file 44 is located. The data entry screen 50 may further include a second data input field 54 at which the user may enter a reference designator that identifies the ball-grid array component to be attached to the printed circuit board 14. As will be understood by one having ordinary skill in the art, each component associated with a printed circuit board 14 is assigned a unique reference designator in the neutral file 44. For example, each resistor associated with a printed circuit board 14 is identified by the letter "R" followed by a unique number designation, e.g., R1, R2, etc. Likewise, each ball-grid array component associated with a printed circuit board 14 is typically identified by the letter "U" followed by a unique number designation, e.g., U1, U2, etc. The data entry screen 50 may additionally include a third data input field 56 by which a user may enter information that identifies a quadrant of the printed circuit board, as placed on the machine 10, at which the ball-grid array component is to be attached.

The printed circuit board 14 may be divided into four quadrants 58, 60, 62 and 64 as shown in FIG. 3 by dividing the surface area of the printed circuit board 14 in half in both the x and y directions. The data entry screen 50 may include a set of illustrations 66, 68, 70, 72 that are numbered one through four on the data entry screen 50, each illustration 66, 68, 70 and 72 showing the printed circuit board 14 divided into four quadrants 58, 60, 62 and 64 and each illustration showing a ball-grid array component 74 attached in a different quadrant 58, 60, 62 and 64. Using the illustrations 66, 68, 70 and 72, the user may enter the number (one, two three or four) associated with the illustration 66, 68, 70, 72 that shows the quadrant 58, 60, 62, 64 in which the ball-grid array component 74 shall be attached. Of course, the number of the illustration 66, 68, 70, 72 entered by the user into the third data input field 56 will depend upon the orientation of the printed circuit board 14 when disposed on the table 12. The data entry screen 50 may also include a fourth data input field 76 by which a user may enter information that identifies a unique computer filename for storing the output data set that may be used to automatically program the paste dispensing machine 10. In addition to the data input fields 52, 54, 56 and 76 described above, the data entry screen 50 may further include a set of user-selectable buttons 78, 80. The first button 78, titled "Go Get it Boy!," when selected by the user using, for example, a mouse (not shown) may cause the computer 36A to generate the data set used to program the paste dispensing machine as will be described in greater detail below. The second button 80, when selected by the user, may cause the data input fields 52, 54, 56 and 76 to clear so that the user may enter data for generating a new set of data for programming the paste dispensing machine 10.

Selecting the button titled, "Go Get it Boy!" (see FIG. 6) invokes the program shown in FIG. 5A that generates the set of positional data (step 84) and causes the processor 41 to read the data entered into the first data input field 52 (step 86). The processor 41 then uses the data to access the directory specified in the first data input field 52 and attempts to locate the neutral file 44 (steps 88 & 90). If the file is not located in the designated directory, the processor 41 causes a message to be displayed to the user indicating that the neutral file 44 cannot be located (step 92). If instead the neutral file 44 is located in the directory designated in the first data input field 52, then the processor 41 reads the neutral file 44 to obtain the physical dimensions of the printed circuit board 14 and then causes the physical dimensions to be stored in the memory device 42 (step 94).

Figure 5B:
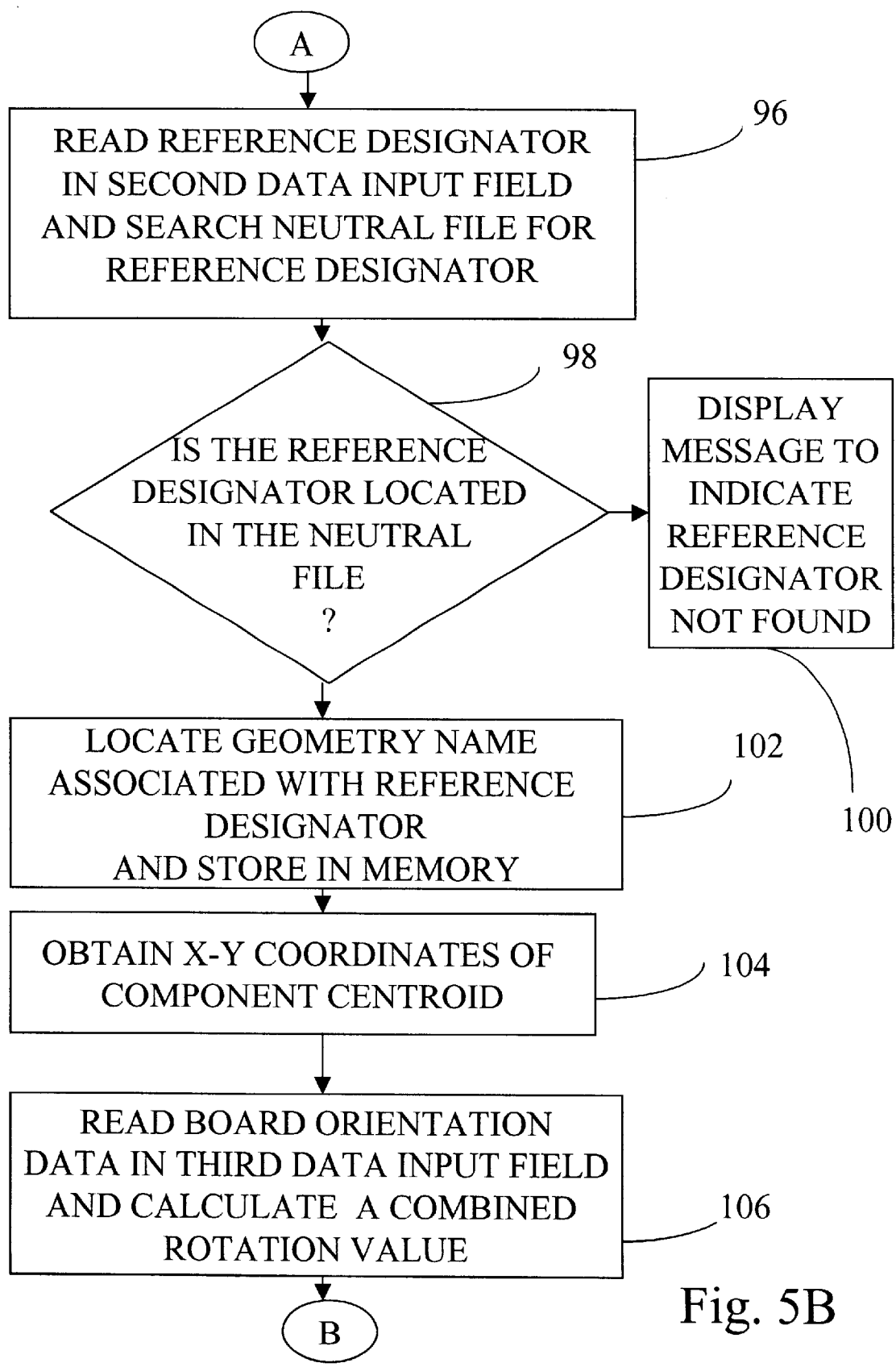

As will be understood by one having ordinary skill in the art and as specified above, the neutral file 44 is arranged according to a predefined format such that the predefined format may be used to determine where the circuit board dimensions are located in the neutral file 44. Referring also to FIG. 5B which continues the flow chart of FIG. 5A at the connecting point A, after accessing and storing the dimensions of the printed circuit board 14, the processor 41 accesses the reference designator of the ball-grid array component entered by the user into the second data input field 54 and then uses the reference designator to locate a line of text in the neutral file 44 that associates the reference designator with a geometry name (steps 96 & 98). If the processor 41 cannot locate the reference designator in the neutral file 44, the processor 41 causes a message to be displayed to the user indicating that the reference designator cannot be located (step 100). If instead the processor 41 locates the reference designator in the neutral file 44, then the processor 41 stores the geometry name associated with the reference designator in the memory device 42 (step 102).

Figure 7:
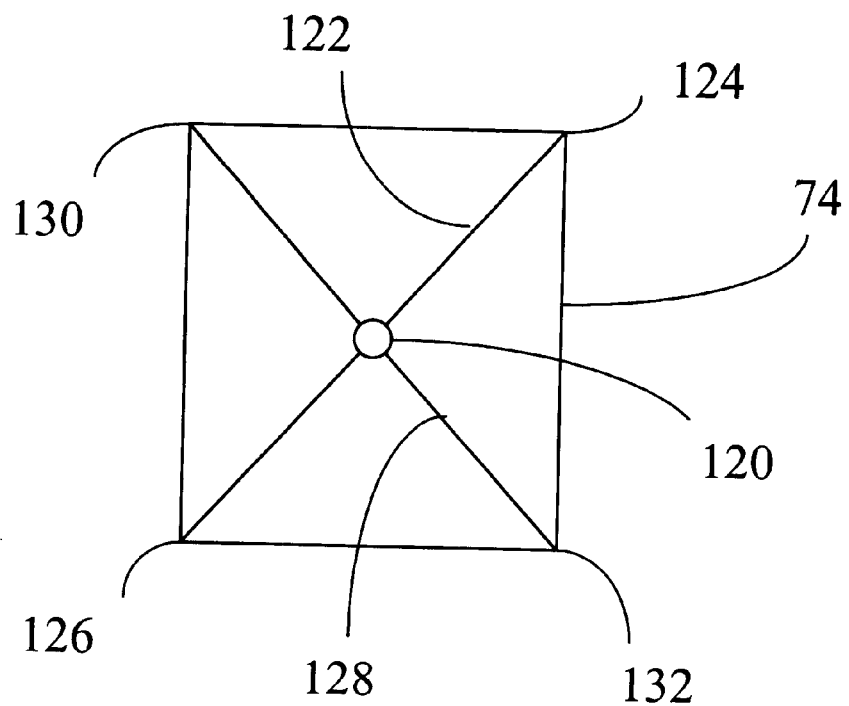
FIG. 7 is a diagram of a ball-grid array component that may be attached to the printed circuit board of FIG. 3; and, FIG. 8 is a diagram of a spiral pattern for applying paste to the printed circuit board of FIG. 3.

The processor 41 also obtains a set of x-y coordinates of a centroid 120 as shown in FIG. 7 associated with 74 ball-grid array component 74 from the line of text in the neutral file 44 that associates the reference designator with the geometry name and stores the x-y coordinates of the centroid 120 in the memory device 42. The x-y coordinates represent the position at which the centroid 120 of the ball-grid array component 74 is located relative to a first coordinate system. As will be understood by one having ordinary skill in the art, the ball-grid array component 74 typically has a square or a rectangular shape and the centroid 120 is located at the intersection of a first imaginary line 122 extending from a first corner 124 of the ball-grid array component 74 to a second corner 126 that opposes the first corner 124, and a second imaginary line 128 extending from a third corner 130 of the ball-grid array component 74 to a fourth corner 132 that opposes the third corner 130.

After storing the coordinates of the centroid 120, the processor 41 accesses the board orientation information entered by the user into the third data input field 56 and combines this board orientation information with the as-designed quadrant location of the centroid 120 to determine a combined rotation value for the ball-grid array component 74 relative to the original design-orientation of the printed circuit board 14 (step 106). Specifically, the x-y coordinates of the centroid 120 are defined relative t6 the first coordinate system which has its origin located at a lower left corner of the printed circuit board 14 when the printed circuit board 14 is disposed in a first orientation. In contrast, a second coordinate system has its origin at the lower left corner of the printed circuit board 14 when the printed circuit board 14 is disposed in a second orientation. The second orientation coincides with the orientation of the printed circuit board 14 as the board 14 is positioned on the table 12 of the paste dispensing machine 10. Moreover, the computer 24 is programmed to position the needle 16 using positional coordinates that are defined relative to the second coordinate system. Thus, the processor 41 is programmed to determine a number of degrees, a combined rotation value, by which the first coordinate system is rotated relative to the second coordinate system (step 106). For example, if the printed circuit board 14 is disposed on the table 12 such that the first and second orientations are the same, then the first and second coordinate systems coincide, i.e., the first coordinate system is rotated zero degrees relative to the second coordinate system. As a result, the processor 41 rotates the centroid data by zero degrees.

Figure 5C:
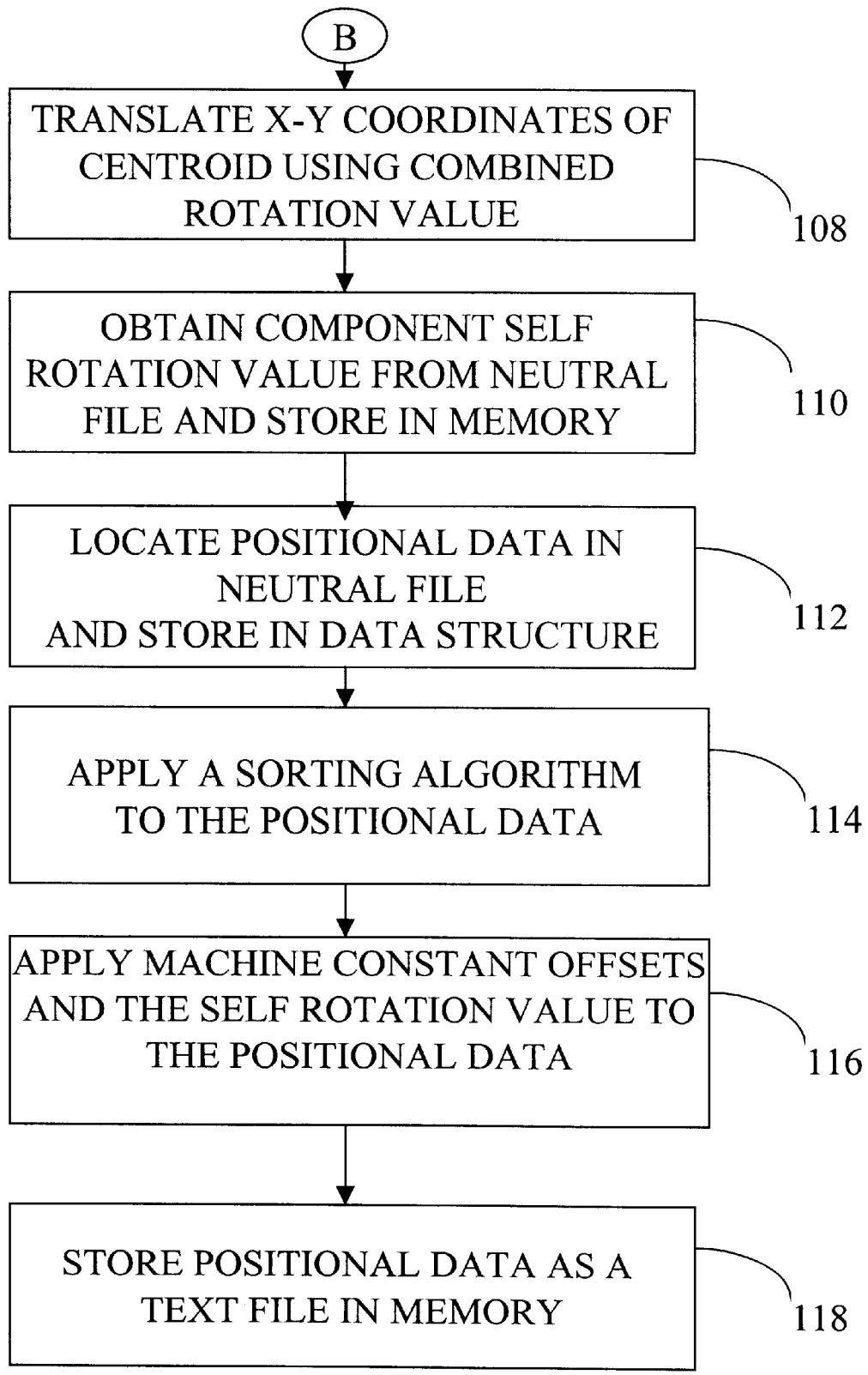

Referring also to FIG. 5C which continues the flowchart 80 of FIG. 5B at the connecting point B, the processor 41 then uses the combined rotation value to translate the x-y coordinates of the centroid 120 obtained from the neutral file 44 into a new set of x-y coordinates that provide the location of the centroid 120 relative to the second coordinate system, i.e., relative to the lower left corner of the printed circuit board 14 as the board is positioned on the table 12 of the paste dispensing machine 10 (step 108). Of course, if the combined rotation value indicates that the first and second coordinate systems do coincide, then translation is not required and thus will not be performed. After translating the x-y coordinates of the centroid 120, the processor 41 reads the neutral file 44 to obtain the self rotation value of the ball-grid array component 74 and then stores the self rotation value in the memory 42 (step 110). As will be understood by one having ordinary skill in the art, the self rotation value of the ball-grid array component 74 indicates whether the designer rotated the ball-grid array component 74 relative to its as-built orientation, i.e., the orientation specified in the component library, and, if so, the degrees by which the designer rotated the ball-grid array component 74 relative to its conventional orientation. If, for example, a Mentor Graphics CAD tool was used to generate the neutral file 44, the self rotation value will be located in the line of text in the neutral file 44 that contains the geometry name associated with the reference designator of the ball-grid array component 74.

Next, the processor 41 scans the neutral file 44 to obtain a set of positional coordinate data that represent the locations at which each of the input/output pins associated with the ball-grid array component 74 to be attached to the printed circuit board 14 are located (step 112). The positional coordinate data is referenced to a local coordinate system having the centroid 120 of the ball-grid array component 74 as the origin (0,0). As described above, a set of pads 26 disposed on the printed circuit board 14 correspond to and align with each of the input/output pins disposed on the ball-grid array component 74. Thus, the coordinate data also indicates the location of each of the pads 26 on the printed circuit board 14 to which paste shall be applied for attaching the ball-grid array component 74. If, for example, the neutral file was created using a Mentor Graphics EECAD software tool, then the set of positional data is located in a section of the file that begins with a text tag, "/GEOM_<geometry name of the component>," wherein "geometry name of the component" represents the geometry name associated with the reference designator. After locating the data, the processor 41 also causes the positional data to be stored in a data structure (not shown) located in the memory 42 (step 112).

Figure 1:
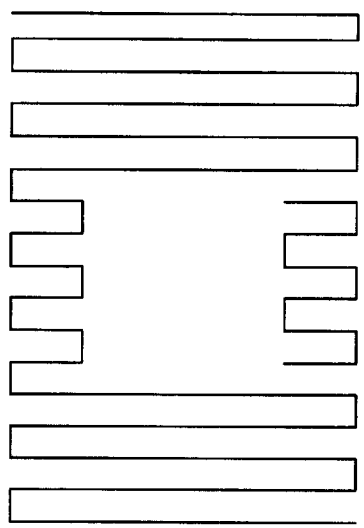
FIG. 1 is a diagram of a serpentine path often used to manually program a paste dispensing machine.
Figure 8:
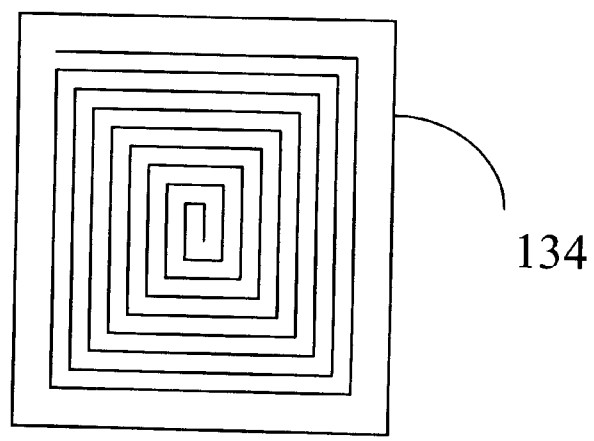

The processor 41 next applies a sorting algorithm on the positional data disposed in the data structure that causes the positional data to be re-ordered to form a desired pattern, such as, for example, a spiral pattern (step 114). More particularly, the re-ordered data, when supplied to the paste-dispensing machine 10, causes the paste dispensing machine 10 to apply paste to the pads 26 located at each set of positional coordinates according to the order in which the set of positional coordinates appears in the data set. Further, applying the paste to the pads 26 according to the order in which the sets of positional coordinates appear in the data set may cause the dispensing needle 16 of the paste dispensing machine 10 to traverse, for example, a spiral path similar to that illustrated in FIG. 8. Alternatively, the data may be re-ordered to form any desired pattern. Thus, the sorting algorithm rearranges the data retrieved from the source neutral file so that it results in an efficient pattern that minimizes machine movement. Specifically, when following a spiral path the gantry 18 disposed on the paste dispensing machine 10 makes fewer directional changes than would be required if a serpentine path (see FIG. 1) were followed, in part because the spiral path includes a greater number of straight lines that extend for a longer distance than are included in the serpentine path. Data patterns that cause the paste dispensing machine to make fewer directional changes are typically favored because directional changes tend to jar the gantry 18 and thus, may shorten the life span of the paste dispensing machine 10.

As will be appreciated by one having ordinary skill in the art, an algorithm that causes the data to be sorted in a spiral pattern may be performed in any number of ways. For example, the algorithm may require that a positional coordinate having an x coordinate value that is equal to the lowest possible x coordinate and having a y coordinate value that is equal to the highest possible y coordinate be located in a first position of the data structure. The algorithm may then require that all of the other positional coordinates having a y coordinate equal to the highest possible y coordinate be obtained. The algorithm may then cause all of the other positional coordinates having a y coordinate equal to the highest possible y coordinate to be arranged in an ascending order according to the value of the corresponding x coordinate. The algorithm may then cause all of the positional coordinates having a y coordinate equal to the highest possible y coordinate minus one to be obtained. The obtained coordinates may then be arranged in a descending order according to the value of the corresponding x coordinate. The algorithm may continue in this manner until all of the data has been arranged appropriately.

After the positional data stored in the data structure has been reordered to form a spiral pattern or any other desired pattern, the processor 41 applies a set of machine constant offsets and the component self rotation value stored in the memory device 42 to the positional data (step 116). Specifically, the processor uses the machine constant offsets and the component self rotation value to shift the data coordinates stored in the data structure so that each set of positional data coordinates corresponds to the exact location at which each of the set of pads 26 corresponding to the individual input/output pins of the ball-grid array component 74 are located relative to the lower left corner of the printed circuit board 14 as the board 14 is positioned on the table 12 of the paste dispensing machine 10. Thus, the positional data stored in the data structure may now be used by the paste dispensing machine 10 to apply paste to the set of pads 26 of the printed circuit board 14 so that the ball-grid array component 74 may be attached thereto. As will be understood by one having ordinary skill in the art, the machine offset constants may take into account various offsets specific to the individual paste dispensing machine 10 in use including. Specifically, the offset may be equal to the distance between an extreme-most position at which the gantry may be driven in either the x or y directions and the position at which the lower left corner of the printed circuit board is located.

Lastly, the processor 41 causes the positional data stored in the data structure to be stored in a text file 45 (see FIG. 4) using a format that can be understood by the computer 24 associated with the paste dispensing machine 10 and using the name entered by the user into the fourth data input field 76 (step 118). The processor 41 may further allow the user to download the text file 45 by clicking, for example, a SAVEAS menu on a menu bar associated with the browser (not shown) that causes the text file 45 to be copied to a disk drive (not shown) coupled to the computer 36A or that causes the text file 45 to be copied into a directory stored on the memory device 34 that is accessible to the paste dispensing machine 10. The user may then instruct the computer 24 that controls the paste dispensing machine 10 to read the text file 44 and start running the program thereby causing the paste dispensing machine 10 to apply paste to each of the set of pads 26 so that the ball-grid array component 74 may be attached to the printed circuit board 14.

From the foregoing description, it should be understood that an improved apparatus and method of programming a paste dispensing machine has been shown and described, which has many desirable attributes and advantages. The apparatus and method allow programming of the paste dispensing machine to occur in an automated fashion thereby eliminating the time that would otherwise be spent by an operator performing the tedious task of manually programming the machine. In addition, the time and cost associated with the extensive training required to prepare a machine operator to manually program the paste dispensing machine are saved. Further, the method allows the productivity of the paste dispensing machine to increase because the machine is no longer inaccessible for the length of time that would otherwise be spent time manually programming the machine.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for generating a set of input data for a paste dispensing machine, the method comprising the steps of:
   accessing a neutral file to obtain a set of positional data, said set of positional data being defined relative to a first coordinate system, wherein said set of positional data represents a set of positions at which a set of pads are located on a printed circuit board;
   converting said set of positional data to be defined relative to a second coordinate system, wherein said paste dispensing machine uses said second coordinate system to dispense paste onto said printed circuit board; and
   causing said converted set of positional data to be stored in a computer file, said computer file being formatted for said paste dispensing machine such that said converted set of positional data comprises said input data for said paste dispensing machine.

2. The method of claim 1 wherein said step of converting said set of positional data to be defined relative to a second coordinate system comprises the steps of:
   obtaining a set of centroid coordinates from said neutral file, said set of centroid coordinates defining a position at which a centroid of a ball-grid array component is located, wherein said set of centroid coordinates are defined relative to said first coordinate system;
   obtaining board orientation data that defines a position in which said printed circuit board is oriented, wherein said board orientation data is defined relative to said second coordinate system;
   comparing said board orientation data to said set of centroid coordinates to determine whether said first coordinate system is rotated relative to said second coordinate system;
   calculating a combined rotation value based on said step of comparing, wherein said combined rotation value indicates an amount by which said first coordinate system is rotated from said second coordinate system; and,
   translating said set of centroid coordinates using said combined rotation value.

3. The method of claim 2 wherein said step of converting said set of positional data to be defined relative to a second coordinate system further comprises the steps of:
   obtaining a self rotation value, said self rotation value indicating an amount by which said component is rotated relative to an as-built orientation;
   obtaining a set of machine constant offsets, wherein said machine constant offsets represent offsets associated with said paste dispensing machine; and
   shifting said set of positional data using said self rotation value and said machine constant offsets.

4. The method of claim 1 further comprising the step of applying a sorting algorithm to said converted set of positional data, said sorting algorithm causing said converted set of positional data to be arranged in a desired pattern, wherein arranging said converted set of positional data in said desired pattern causes said paste dispensing machine to apply paste to said printed circuit board in said desired pattern when said converted set of positional data is input to said paste dispensing machine.

5. The method of claim 4 wherein said desired pattern causes said paste dispensing machine to change directions infrequently.

6. The method of claim 4 wherein said desired pattern minimizes the number of directional changes made by said paste dispensing machine when applying said paste to said printed circuit board.

7. The method of claim 4 wherein said desired pattern minimizes the number of movements made by said paste dispensing machine when applying said paste to said printed circuit board.

8. The method of claim 4 wherein said desired pattern comprises a spiral pattern.

9. A computer program product comprising a computer usable medium having computer readable program code embodied in said medium that when executed causes a computer to:
   access a neutral file to obtain a set of positional data, said set of positional data being defined relative to a first coordinate system, wherein said set of data represents a set of positions at which a set of pads are located on a printed circuit board;
   convert said set of positional data to be defined relative to a second coordinate system, wherein said paste dispensing machine is adapted to dispense paste onto said pads of said printed circuit board using said second coordinate system; and,
   store said converted set of positional data in a computer text file, said computer text file being arranged in a format that is compatible with said paste dispensing machine.

10. The computer program product of claim 9 wherein said computer readable program code embodied in said medium that causes said computer to convert said set of positional data to be defined relative to a second coordinate system further causes said computer to:
    obtain a set of centroid coordinates, said coordinates defining a position at which a centroid of a ball-grid array component is located, wherein said coordinates are defined relative to said first coordinate system;
    obtain board orientation data that defines a position in which said printed circuit board is oriented, wherein said board orientation data is defined relative to said second coordinate system;
    compare said board orientation data to said set of coordinates to determine whether said first coordinate system is rotated relative to said second coordinate system;
    calculate a combined rotation value based on said step of comparing, wherein said combined rotation value indicates an amount by which said first coordinate system is rotated relative to said second coordinate system; and, translate said set of centroid coordinates using said combined rotation value.

11. The computer program product of claim 10 wherein said computer readable program code embodied in said medium that causes said computer to convert said set of positional data to be defined relative to a second coordinate system further causes said computer to:

obtain a self rotation value, said self rotation value indicating an amount by which said component is rotated relative to a conventional orientation;

obtain a set of machine constant offsets, wherein said machine constant offsets represent offsets associated with said paste dispensing machine; and, shift said set of positional data using said self rotation value and said machine constant offsets.

12. The computer program product of claim 9 wherein said computer readable program code embodied in said medium further causes said computer to:

apply a sorting algorithm to said converted set of positional data, said sorting algorithm causing said converted set of positional data to be arranged in a desired pattern; wherein arranging said converted set of positional data in said desired pattern causes said paste-dispensing machine to apply paste to said printed circuit board in said desired pattern when said converted set of positional data is input to said paste dispensing machine.

13. The computer program product of claim 12 wherein said desired pattern comprises a spiral pattern.

14. A computer system for generating a set of input data for a paste dispensing machine, the computer system comprising:

a memory device containing a neutral file, wherein said neutral file includes a set of positional data describing a set of positions at which a set of pads are disposed on a printed circuit board;

a processor configured and adapted to access said memory device, said processor being further adapted to extract said set of positional data from said neutral file, wherein said set of data is defined relative to a first coordinate system; and, wherein said processor is further adapted to convert said set of positional data to be defined relative to a second coordinate system, wherein said paste dispensing machine is adapted to use said second coordinate system to dispense paste onto said printed circuit board; and, further wherein said processor is further adapted to cause said converted set of positional data to be stored in a computer text file, said computer text file being arranged in a format that is compatible with said paste dispensing machine.

15. The computer system of claim 14 wherein said processor is further adapted to obtain a set of centroid coordinates from said neutral file, wherein said coordinates define a position at which a centroid of a ball-grid array component is located and wherein said centroid coordinates are defined relative to said first coordinate system, and wherein said processor is further adapted to obtain board orientation data wherein said board orientation data defines a position in which said printed circuit board is oriented and wherein said board orientation data is defined relative to said second coordinate system, and further wherein said processor is further adapted to compare said board orientation data to said set of centroid coordinates to determine whether said first coordinate system is rotated relative to said second coordinate system.

16. The computer system of claim 15 wherein said processor is further adapted to calculate a combined rotation value based on said step of comparing, wherein said combined rotation value indicates an amount by which said first coordinate system is rotated relative to said second coordinate system; and wherein said processor is further adapted to translate said set of centroid coordinates using said combined rotation value.

17. The computer system of claim 16 wherein said processor is further adapted to obtain a self rotation value and a set of machine constant offsets, wherein said self rotation value indicates an amount by which said component is rotated relative to a conventional orientation, and wherein said machine constant offsets represent offsets associated with said paste dispensing machine, and further wherein said processor is further adapted to shift said set of positional data using said self rotation value and said machine constant offsets.

18. The computer system of claim 14 wherein said processor is further adapted to apply a sorting algorithm to said converted set of positional data, wherein said sorting algorithm causes said converted set of positional data to be arranged in a desired pattern, and wherein arranging said converted set of positional data in said desired pattern causes said paste-dispensing machine to apply paste to said pads of said printed circuit board in a desired pattern when said converted set of positional data is input to said paste dispensing machine.

19. The computer system of claim 18 wherein said desired pattern comprises a spiral pattern.

20. The computer system of claim 14 wherein said processor is further adapted to generate a data input screen wherein input data may be entered.

21. The computer system of claim 20 wherein said input data comprises a name of said neutral file and a name of a directory wherein said neutral file is stored.

22. The computer system of claim 20 wherein said data input screen comprises a set of data input fields at which a user may enter data.

23. The computer system of claim 20 wherein said processor comprises a first processor, said system further comprising a second processor communicatably coupled to said first processor via a network, and wherein said user may access said data input screen via said second processor.

* * * * *